(12) United States Patent
Chen et al.

(10) Patent No.: US 11,399,443 B2
(45) Date of Patent: Jul. 26, 2022

(54) METHOD AND DEVICE FOR CONTROLLING REMOVAL OF A MODULE WITH ELECTRICAL CONNECTORS FROM A COMPUTER CHASSIS

(71) Applicant: QUANTA COMPUTER INC., Taoyuan (TW)

(72) Inventors: Chao-Jung Chen, Taoyuan (TW); Hou-Hsien Chang, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 26 days.

(21) Appl. No.: 17/071,403

(22) Filed: Oct. 15, 2020

(65) Prior Publication Data
US 2022/0030732 A1 Jan. 27, 2022

Related U.S. Application Data

(60) Provisional application No. 63/055,642, filed on Jul. 23, 2020.

(51) Int. Cl.
*H05K 7/14* (2006.01)
*G06F 1/18* (2006.01)
(52) U.S. Cl.
CPC ........... *H05K 7/1402* (2013.01); *G06F 1/186* (2013.01)

(58) Field of Classification Search
CPC .. H05K 7/1402; H05K 1/14; H05K 2201/044; G06F 1/186; G06F 1/183; H01R 12/7005
See application file for complete search history.

(56) References Cited

U.S. PATENT DOCUMENTS 5,296,748 A * 3/1994 Wicklund ............ H05K 7/1445
326/101
9,116,660 B1 * 8/2015 Widmann ............ H05K 7/1445

* cited by examiner

*Primary Examiner* — James Wu
(74) *Attorney, Agent, or Firm* — Nixon Peabody LLP (57) ABSTRACT

A locking mechanism for a computing device controls movement of a removable module within a computer chassis. The locking mechanism comprises a lock pin, a head, and a spring stopper. The lock pin includes an elongated shaft and a head. The spring stopper is disposed on the elongated shaft. The spring is disposed about the elongated shaft such that the spring extends from the spring stopper toward an end of the elongated shaft. As the lock pin moves along a longitudinal axis of the elongated shaft from a first position to a second position, the spring is configured to compress between the spring stopper and a fixed bracket in the computer chassis. The opposite second end extends through a hole in the removable module, thereby preventing the removable module from being removed from the computer chassis.

20 Claims, 11 Drawing Sheets

METHOD AND DEVICE FOR CONTROLLING REMOVAL OF A MODULE WITH ELECTRICAL CONNECTORS FROM A COMPUTER CHASSIS

CROSS-REFERENCE TO RELATED APPLICATION

This application claims priority under 35 U.S.C. § 119 to U.S. Provisional Application No. 63/055,642, entitled "PROTECTION DEVICE FOR PREVENTING IMPROPER REMOVAL OF MODULE", filed on Jul. 23, 2020. The contents of that application are hereby incorporated by reference in their entirety.

FIELD OF THE INVENTION

The present invention relates to controlling removal of a module from a computer chassis. More specifically, the present invention relates to methods and devices for controlling removal of a module with electronic components connected to other electronic components in a computer chassis.

BACKGROUND

A computer chassis includes many electronic components that are connected to each other. Electronic components include the main electronic circuit board, processors, memory, storage devices, network cards, video cards, multimedia cards, expansion cards, other I/O cards, and a power supply. The electronic components can be directly connected to the main electronic circuit board. Electronic components can also be connected through expansion slots or other electronic components to the main electronic circuit board. The electronic components may be a part of vertical or horizontal modules that slide into and out of brackets of the computer chassis before engaging with or disengaging from another electronic component.

Improper ordering of the connection or disconnection of electronic components from each other can cause damage to the connectors and the internal electronics of electronic components. Accordingly, there is a need for the controlling, securing and removal of modules with electronic components that connect with electronic components of other modules.

SUMMARY

According to one embodiment, a locking mechanism for a computing device controls movement of a removable module that includes electronic components connected to other electronic components within a computer chassis. The locking mechanism includes a lock pin, a head, and a spring stopper. The lock pin includes an elongated shaft having a first diameter. The elongated shaft extends from a first end to an opposite second end. The head is disposed at the first end, and has a second diameter greater than the first diameter. The spring stopper is disposed on the elongated shaft between the first end and the opposite second end. The spring is disposed about the elongated shaft such that the spring extends from the spring stopper toward the opposite second end of the elongated shaft. As the lock pin moves along a longitudinal axis of the elongated shaft from a first position to a second position, the spring is configured to compress between the spring stopper and a fixed bracket in the computer chassis. The opposite second end extends through a hole in the removable module, thereby preventing the removable module from being removed from the computer chassis.

In a further aspect of the embodiment, the removable module is positioned vertically in the computer chassis. In another aspect of the embodiment, the lock pin is configured to move from the first position to the second position in response to another removable module including the other electronic components urging the head of the lock pin as the another removable module is inserted into a receiving bracket of the computer chassis. The electronic components of the removable module and the other electronic components of the another removable module are electrically connected when the lock pin is in the second position. In a further aspect of the embodiment, the electronic components of the removable module and the other electronic components of the another removable module are fully disconnected when the lock pin is in the first position. In another aspect of the embodiment, the removable module is positioned vertically, and the another removable module is positioned horizontally in the computer chassis. In yet another aspect of the embodiment, the another removable module includes a rear bracket abutting the head of the lock pin during the urging of the head to the second position.

In a further aspect of the embodiment, the lock pin is configured to move along the longitudinal axis of the elongated shaft from the second position to the first position in response to another removable module including the other electronic components being removed from the computer chassis. The lock pin is urged away at the spring stopper from the hole of the removable module by the spring, thereby allowing the removable module to be removed from the computer chassis. In another aspect of the embodiment, the electronic components of the removable module and the other electronic components of the another removable module are fully disconnected when the lock pin is in the first position. In yet another aspect of the embodiment, the removable module is positioned horizontally and the another removable module is positioned vertically in the computer chassis. In another aspect of the embodiment, the another removable module includes a rear bracket abutting the head of the lock pin during the urging of the head to the first position.

In a further aspect of the embodiment, the spring stopper is fixed to the elongated shaft. In another aspect of the embodiment, the spring stopper includes a ring structure concentric with the elongated shaft. In yet another aspect of the embodiment, the elongated shaft includes a groove about the circumference of the elongated shaft. In another aspect of the embodiment, the spring stopper is secured to the elongated shaft via a protrusion penetrating into the groove. In yet another aspect of the embodiment, the electronic components include a printed circuit board.

According to another embodiment, a method controls the movement of a first removable module in a computer chassis. The removable module includes one or more electronic components configured to be connected to one or more other electronic components in a second removable module. The method includes inserting the first removable module into a first receiving bracket oriented to position the first removable module vertically or horizontally in the computer chassis. The second removable module is inserted into a second receiving bracket until the second removable module abuts a lock pin disposed in one or more supports of an intermediate bracket between the first removable module and the second removable module. The second receiving bracket is oriented to position the second removable module in the computer chassis such that the second removable module is positioned perpendicularly to the first removable module. The second removable module urges a portion of the lock pin into a hole of the first removable module as the second removable module is further inserted into the second receiving bracket to a fully inserted position, thereby preventing the first removable module from being removed.

A further aspect of the embodiment includes the one or more electrical connections between the electronic components of the first removable module and the second removable module being connected when the second removable module is in the fully inserted position. In another aspect of the embodiment, the lock pin includes an elongated shaft and a spring disposed about the elongated shaft. The spring extends from a spring stopper disposed on the elongated shaft toward an end of the lock pin inserted into the hole. The spring is constrained by the spring stopper and one of the supports of the intermediate bracket such that the spring compresses as the second removable module urges the lock pin into the hole of the first removable module. In yet another aspect of the embodiment, the method further includes causing the portion of the lock pin to move out of the hole of the first removable module by initiating removal from the fully inserted position of the second removable module from the second receiving bracket. Moving the lock pin out of the hole allows the first removable module to be removed from the first receiving bracket and allows the one or more electrical connections between the electronic components of the first removable module and the second removable module to be disconnected. In yet a further aspect of the embodiment, the lock pin moves out of the hole of the first removable module in response to the spring expanding as the removing of the second removable module is initiated. The expanding spring causes the urging of the lock pin in the direction of removal.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

The disclosure will be better understood from the following description of embodiments together with reference to the accompanying drawings.

The present disclosure is susceptible to various modifications and alternative forms. Some representative embodiments have been shown by way of example in the drawings and will be described in detail herein. It should be understood, however, that the invention is not intended to be limited to the particular forms disclosed. Rather, the disclosure is to cover all modifications, equivalents, and alternatives falling within the spirit and scope of the invention as defined by the appended claims.

DETAILED DESCRIPTION

The various embodiments are described with reference to the attached figures, where like reference numerals are used throughout the figures to designate similar or equivalent elements. The figures are not drawn to scale, and they are provided merely to illustrate the instant invention. It should be understood that numerous specific details, relationships, and methods are set forth to provide a full understanding. One having ordinary skill in the relevant art, however, will readily recognize that the various embodiments can be practiced without one or more of the specific details, or with other methods. In other instances, well-known structures or operations are not shown in detail to avoid obscuring certain aspects of the various embodiments. The various embodiments are not limited by the illustrated ordering of acts or events, as some acts may occur in different orders and/or concurrently with other acts or events. Furthermore, not all illustrated acts or events are required to implement a methodology in accordance with the present invention.

Elements and limitations that are disclosed, for example, in the Abstract, Summary, and Detailed Description sections, but not explicitly set forth in the claims, should not be incorporated into the claims, singly, or collectively, by implication, inference, or otherwise. For purposes of the present detailed description, unless specifically disclaimed, the singular includes the plural and vice versa. The word "including" means "including without limitation." Moreover, words of approximation, such as "about," "almost," "substantially," "approximately," and the like, can be used herein to mean "at,", "near," or "nearly at," or "within 3-5% of," or "within acceptable manufacturing tolerances," or any logical combination thereof, for example.

With regards to the present disclosure, the terms "computing device" or "computer device" refer to any electronically-powered or battery-powered equipment that has hardware, software, and/or firmware components, where the software and/or firmware components can be configured, for operating features on the device.

It is desirable for electrical connections between electronic components of a computing device to remain connected, and properly disconnected when needed. It is further desirable in some implementations for the connection or disconnection of electronic components to completed in a certain order, such as where the improper ordering of the disconnection can cause damage to the electrical connectors of the electronic components or to the electronic components themselves.

The presently described technology contemplates systems and methods for the orderly insertion and removal of various modules from a computer chassis, such as modules that include electronic components and connectors between the various electronic components secured to the modules. In some implementations, the electronic components are a part of a vertical module or a horizontal module that slide into and out of receiving brackets of the computer chassis before engaging with or disengaging from another electronic component. For example, a vertical module may have electronic components that are connected to electronic components of an adjacent horizontal module and/or to the motherboard of a computing device. In some implementations, the present technology contemplates a locking mechanism that controls or limits the ability to remove one module before another module is removed from the computer chassis. In some implementations, the present technology further contemplates a locking mechanism that controls or limits the ability to remove one module before another module is at least partially removed to the point that any connectors between the electrical components of the two modules have fully disengaged.

Figure 1:
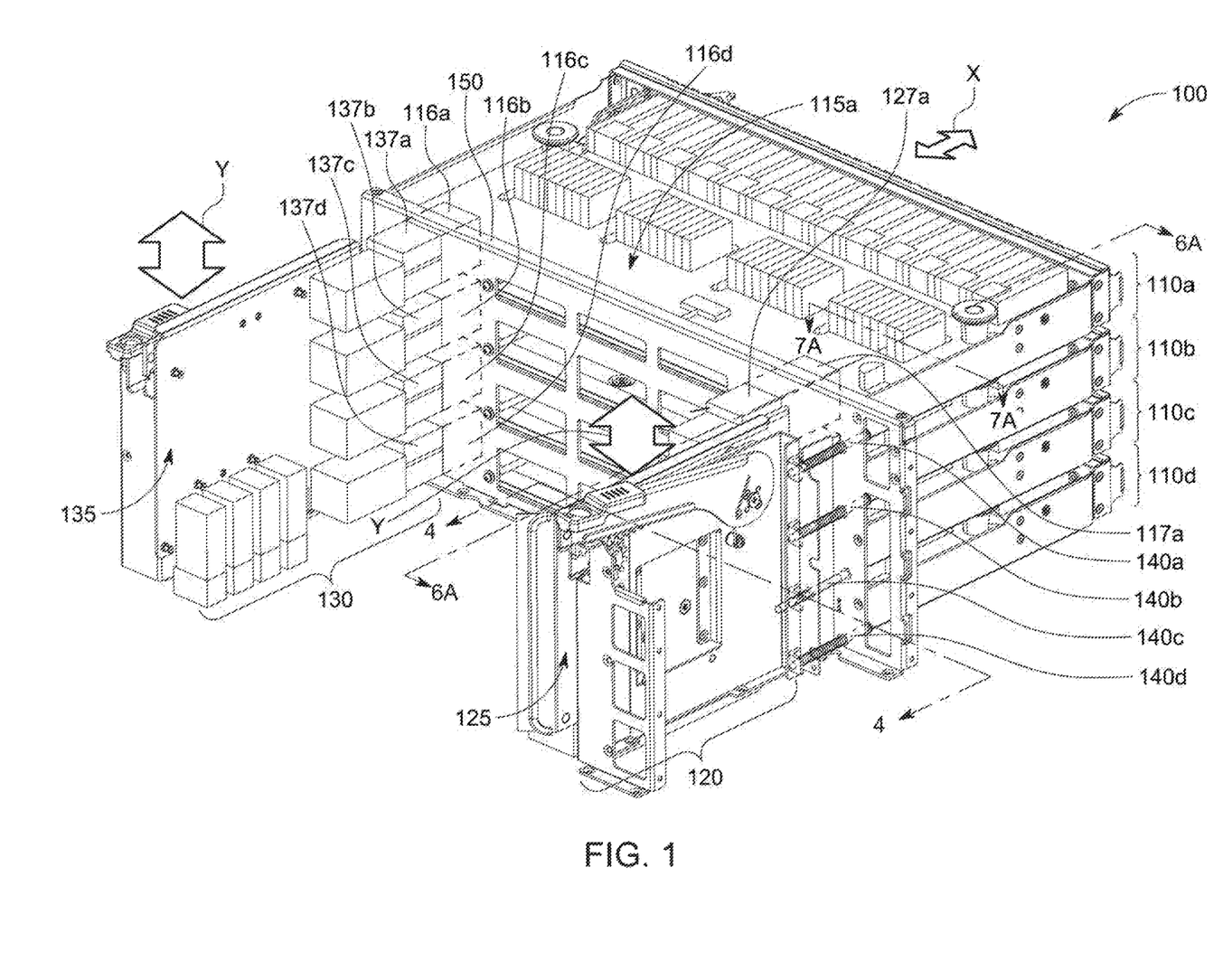
FIG. 1 is a left perspective view of a portion of an exemplary interior of a computer chassis that includes a plurality of horizontal modules electrically connected to a plurality of vertical modules, according to some implementations of the present disclosure.

Turning now to FIG. 1, a left perspective view is depicted of a portion of an exemplary interior of a computer chassis 100 that includes a plurality of horizontal modules, such as horizontal modules 110a, 110b, 110c, 110d, electrically connected to a plurality of vertical modules, such as vertical modules 120, 130. The horizontal modules 110a-110d can be individually inserted and removed from the computer chassis by horizontally sliding the modules along direction X. The vertical modules 120, 130 can also be individually inserted and removed by vertically sliding the modules along direction Y. Both the vertical modules 120, 130 and horizontal modules 110a-110d include various electronic components, such as printed circuit boards 115a, 125, 135, among other electronic components that may be found within a removable module of the computer chassis 100 of a computing device. Each horizontal module may have a printed circuit board, such as printed circuit boards 115c and 115d depicted in FIGS. 6B and 6D The electronic components of the vertical modules 120, 130 and horizontal modules 110a-110d may be electrically connected to connectors that provide an interface for an electrical connection with other electronic components, such as the motherboard or to other electronic components disposed within the computer chassis 100. For example, connectors 127a, 137a, 137b, 137c, 137d associated with one of the vertical modules 120, 130 may provide an electrical connection with a corresponding connector, such as connectors 116a, 116b, 116c, 116d, 117a, 117b, 117c, 117d of the horizontal modules 110a-110d (see FIG. 6A for elements 117b-117d).

The electrical connection between the connectors of the vertical modules 120, 130 and horizontal modules 110a-110d occurs in response to the vertical modules 120, 130 first being fully inserted one at a time into respective receiving brackets of the computer chassis 100. Next, the horizontal modules 110a-110d are individually inserted into separate receiving brackets of the computer chassis 100. Upon full insertion, the electrical connectors, such as connectors 116a, 117a of the horizontal modules 110a-110d fully interface with the corresponding connectors 127a, 137a of the vertical modules 120, 130. The corresponding connectors may electrically connect via male-to-female, female-to-male, or other known connections, where in addition to being electrically connected, there is also a mechanical connection.

During insertion into the computer chassis 100, the horizontal modules 110a-110d engage with a corresponding locking mechanism, such as locking mechanisms 140a, 140b, 140c, 140d, secured to a one or more intermediate brackets of the computer chassis 100, such as middle bracket 150. The locking mechanisms 140a-140d engage with corresponding receiving holes in vertical module 120 as each of the horizontal modules 110a-110d is inserted, such that the vertical module 120 is limited in its movement in along the Y direction until all the locking mechanisms 140a-140d fully disengage from the receiving holes. Similar locking mechanisms can be applied to control the movement of the vertical module 130.

Figure 2:
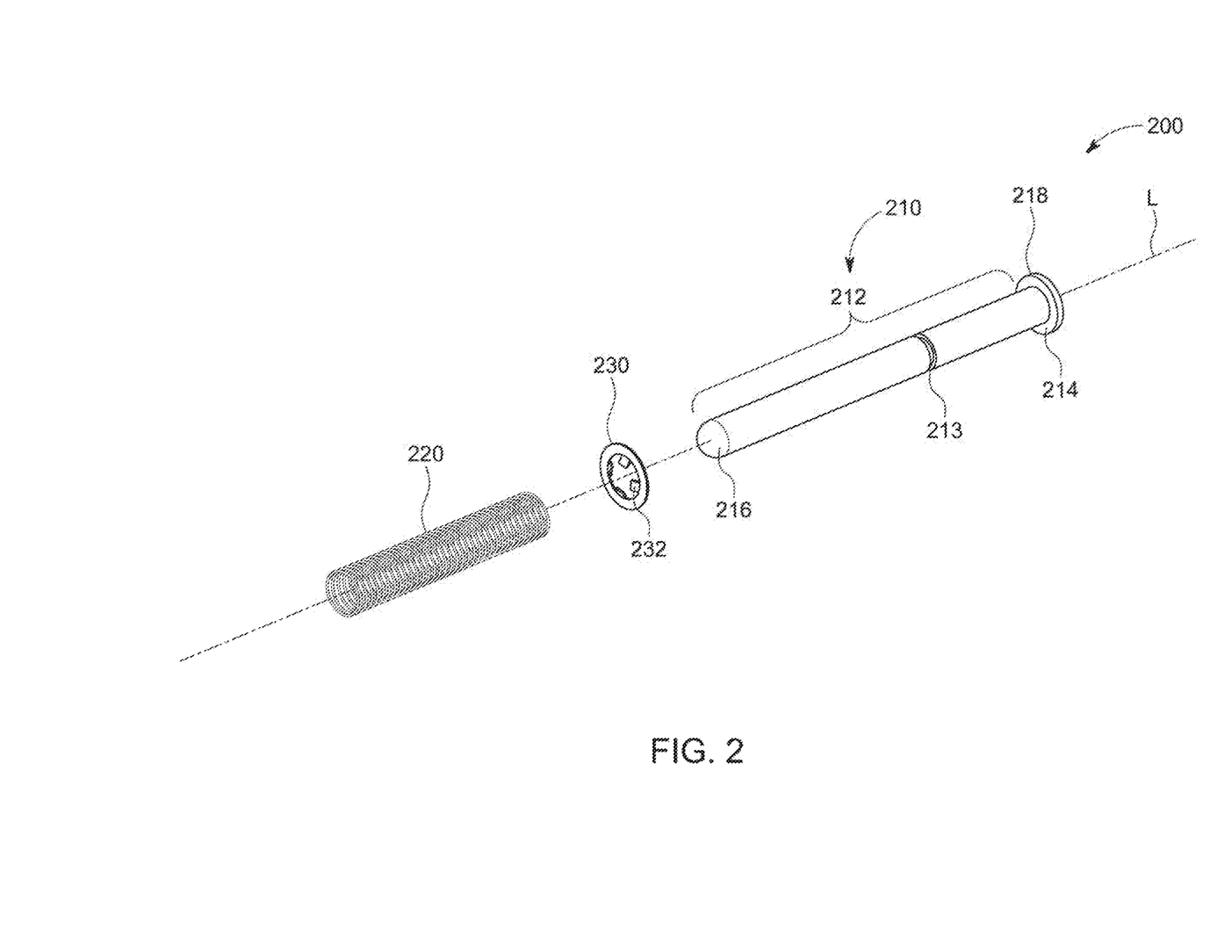
FIG. 2 depicts an exploded perspective view of an exemplary locking mechanism, according to some implementations of the present disclosure.

Turning now to FIG. 2, an exploded perspective view is depicted of a locking mechanism 200 including a lock pin 210, a spring 220, and spring stopper 230. The lock pin 210 has an elongated shaft 212 having a first diameter (or a first transverse cross-sectional dimension). The elongated shaft 212 extends from a first end 214 to an opposite second end 216 defining an imaginary longitudinal axis L, along which the locking mechanism 200 moves when implemented as described for exemplary locking mechanisms 140a-140d (see FIG. 1). While the elongated shaft 212 is depicted as being generally cylindrical with a circular transverse cross-section, the elongated shaft 212 can have other shapes, such as square, rectangular, elliptical, other polygonal, or star shaped transverse cross-sections. In some implementations, the lock pin 210 includes a groove 213 extending about the circumference of the elongated shaft 212.

A head 218 of the lock pin 210 is disposed at the first end 214. The head 218 has a second diameter (or second transverse cross-sectional dimension) that is greater than the first diameter (or first transverse cross-sectional dimension) of the elongated shaft 212.

The locking mechanism 200 further includes a spring stopper 230 disposed between the first end 214 and the second end 216 of the elongated shaft 212. The spring stopper 230 can be secured to the elongated shaft 212 via one or more protrusions 232 penetrating into the groove 212. In some implementations, the spring stopper 230 includes a ring structure that is concentrically disposed about the elongated shaft 212.

In some implementations, one or more protuberances (not shown) may extend about the circumference of the elongated shaft 212 as a substitute for, or in addition to, the groove 213. The protuberances can increase the diameter (or transverse cross-sectional dimension) of the elongated shaft 212 to limit the movement of the spring stopper 230 along the elongated shaft 212 at the protuberance, similar to how one or more protrusions 232 positioned within the groove limit the movement of the spring stopper 230.

The spring 220 of the locking mechanism 200 is disposed about the elongated shaft 212 of the lock pin 210. The spring 220 extends from the spring stopper 230 toward the opposite second end 216 of the elongated shaft 212. The spring 220 is depicted as a cylindrical coil or helical spring, though other springs configurations are contemplated, such as conical, hourglass, barrel, or variable pitch springs, along with other compression spring-like devices.

Figure 3A:
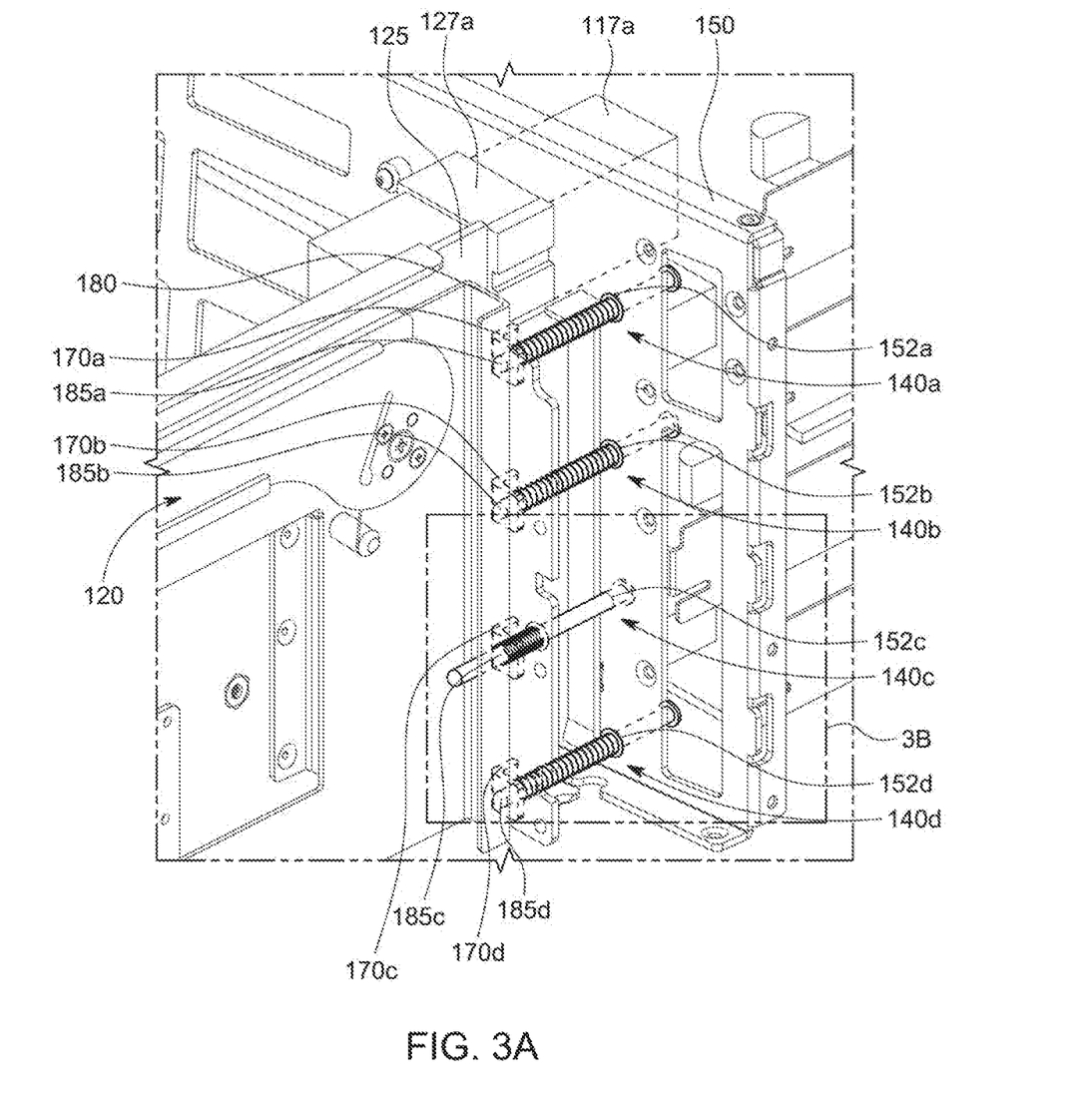
FIGS. 3A and 3B depict left perspective views of locking mechanisms for limiting the vertical modules of FIG. 1 from being removed from the computer chassis, according to some implementations of the present disclosure.
Figure 3B:
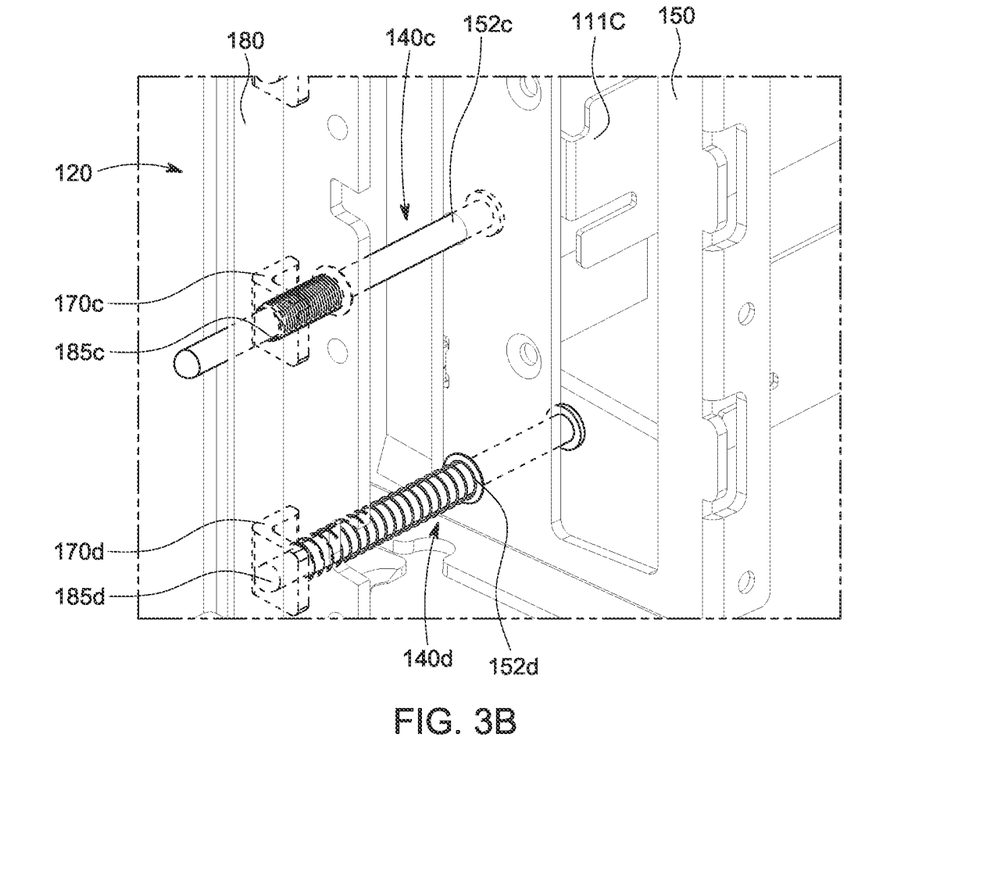

Referring now to FIGS. 3A and 3B, left perspective close-up views are depicted of the locking mechanisms 140a-140d depicted in FIG. 1 for limiting the vertical module 120 from being removed from the computer chassis 100 when one or more of the horizontal modules 110a-110d (FIG. 1) are fully inserted. The locking mechanisms 140a-140d are similar to the locking mechanism 200 depicted in exploded view in FIG. 2, where the element numbering for the lock pin 210, the spring 220, the spring stopper 230, and other features of the locking mechanism 200 will hereinafter be used interchangeably in describing the locking mechanism 140a-140d. Furthermore, locking mechanisms, similar to locking mechanisms 140a-140d, are also utilized for example, to limit the vertical module 130 in FIG. 1 from being removed from the computer chassis 100 when one or more of the horizontal modules 110a-110d are fully inserted.

The locking mechanisms 140a-140d are disposed between the horizontal modules 110a-110d and the vertical module 120. The locking mechanisms 140a-140d are supported by a middle bracket 150 and one or more secondary supporting brackets, such as secondary supporting brackets 170a-170d. The elongated shafts (e.g., see element 212 in FIG. 2) of the lock pins (e.g., see element 210 in FIG. 2) of the locking mechanisms 140a-140d penetrate corresponding holes, such as holes 152a-152c in the middle bracket 150, and similar corresponding holes penetrating the one or more secondary brackets, such as secondary brackets 170a-170d. The elongated shaft 212 is depicted to move along holes 152a-152d from the spring stopper (e.g., see element 230 in FIG. 2) to the first end (e.g., see element 214 in FIG. 2) where the head (e.g., see element 218 in FIG. 2) cannot penetrate the hole 152a-152d. The elongate shaft 212 of the lock pin 210 extends through at least corresponding holes in the secondary bracket 170a-170d, such that the lock pin 210 of each locking mechanism sliding move along the longitudinal axis (e.g., see L in FIG. 2) of the elongated shaft 212, but is otherwise generally constrained from moving in other directions.

The locking mechanisms 140a, 140b, 140d are depicted with the opposite second end (e.g., see element 216 in FIG. 2) of the elongate shaft 212 of each corresponding lock pin 210 positioned such that the lock pin 210 has not engaged or penetrated a corresponding hole, such as holes 185a, 185b, 185d (see also FIG. 4) in a fixed bracket 180 of the vertical module 120. The corresponding holes 185a-185d in the fixed bracket 180 of the vertical module 120 receive the opposite second end of the elongated shaft 212 of each lock pin 210. Prior to inserting a horizontal module, such as horizontal modules 110a, 110b, 110d, in the computer chassis, each spring (e.g., see element 220 in FIG. 2) of the locking mechanisms 140a, 140b, 140d is in a generally uncompressed state and is constrained by the spring stopper (e.g., see element 230 in FIG. 2) at one end of the spring 220 and the corresponding secondary brackets, such as secondary brackets 170a, 170b, 170d, at the other end of the spring 220.

The locking mechanism 140c is depicted with the opposite second end (e.g., see element 216 in FIG. 2) of the elongate shaft (e.g., see element 212 in FIG. 2) of the lock pin (e.g., see element 210 in FIG. 2) positioned such that the lock pin 210 engages or penetrates a corresponding hole, such as hole 185c in the fixed bracket 180 of the vertical module 120. The spring 220 is in a compressed state for locking mechanism 140c and is similarly constrained by the spring stopper 230 at one end and the respective secondary bracket 170c at the other end. The spring 220 is compressed for locking mechanism 140c due to the horizontal module 110c (see FIG. 1) being fully inserted into the computer chassis 100. In contrast, the horizontal modules 110a, 110b, 110d (see FIG. 1) have not been inserted in the computer chassis 100 to the point where the horizontal modules urge the head (e.g., see element 218 in FIG. 2) of corresponding locking mechanisms 140a, 140b, 140d toward the vertical module 120 and compress the corresponding spring 220 so that the corresponding lock pin 210 engages the corresponding hole 185a, 185b, 185d in the fixed bracket 180 of the vertical module 120.

For the locking mechanisms 140a-140d, the corresponding lock pin 210 moves along the longitudinal axis L of the elongated shaft 212 from a first position (e.g., see elements 140a, 140b, 140d) fully disengaged from the vertical module 120 with the corresponding spring 220 in an uncompressed or near uncompressed state, to a second position (e.g., see element 140c) with fully engaged with the vertical module 120 and the corresponding spring 220 compressed. The spring 220 compresses between the spring stopper 230 and the secondary bracket 170 in the computer chassis 100 (see FIG. 1). The opposite second end 216 of the corresponding elongated shaft 212 extends through the hole 185c in the fixed bracket 180 fixed to the vertical module 120. While four exemplary locking mechanisms 140a-140d are depicted, one locking mechanism acting alone can prevent the vertical module 120 from being removed from the computer chassis 100.

Figure 4:
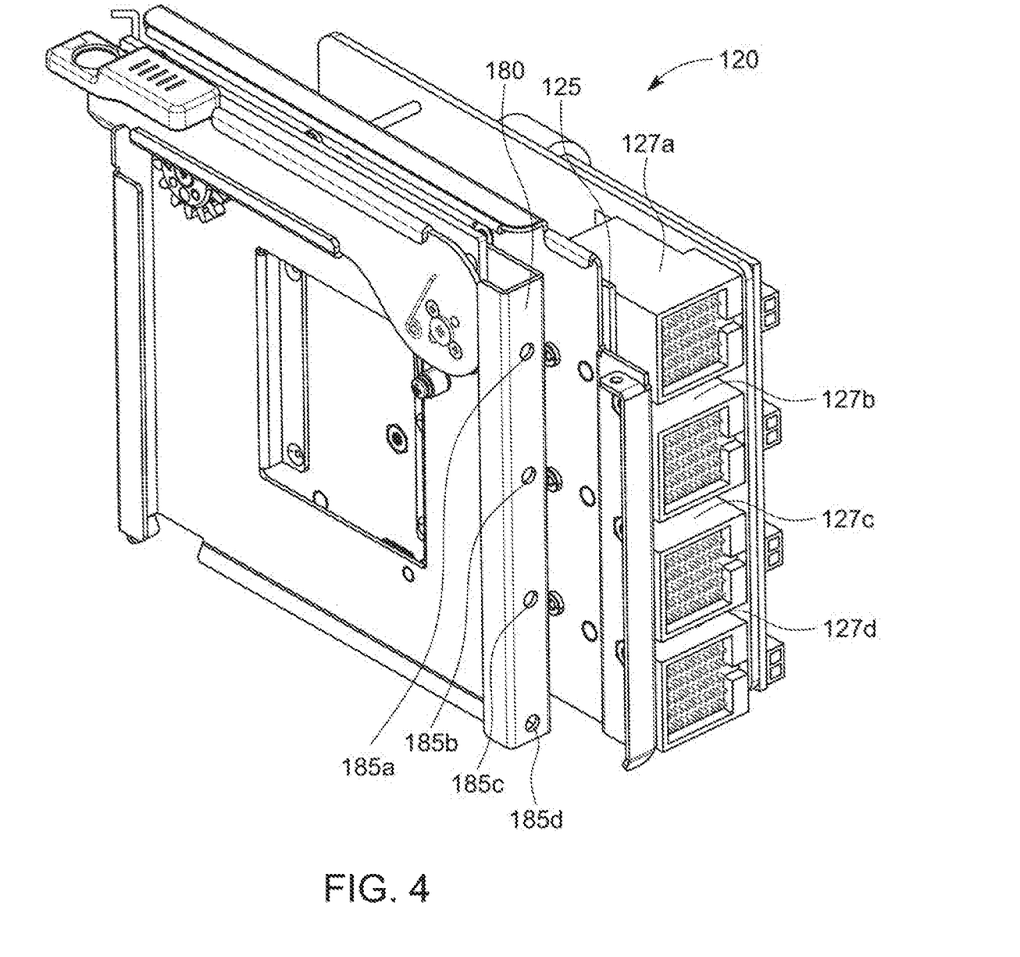
FIG. 4 depicts a right perspective view of a vertical module including electrical connectors for electrically connecting to a plurality of horizontal modules, according to some implementations of the present disclosure.

Turning now to FIG. 4, a right perspective view is depicted of the vertical module 120. The vertical modules 120 include a plurality of connectors 127a-127d for electrically connecting to corresponding connectors, similar to connectors 117a-117d (see FIGS. 1, 3A, and 6A), disposed on a plurality of horizontal modules, such as horizontal modules 110a-110d (see FIG. 1). The vertical module 120 further includes a fixed bracket 180 fixed to the vertical module 120. The fixed bracket 180 includes a plurality of holes, such as holes 185a-185d, for receiving the opposite second ends (e.g., see element 216 in FIG. 2) of the plurality of locking mechanisms 140a-140d.

Figure 5A:
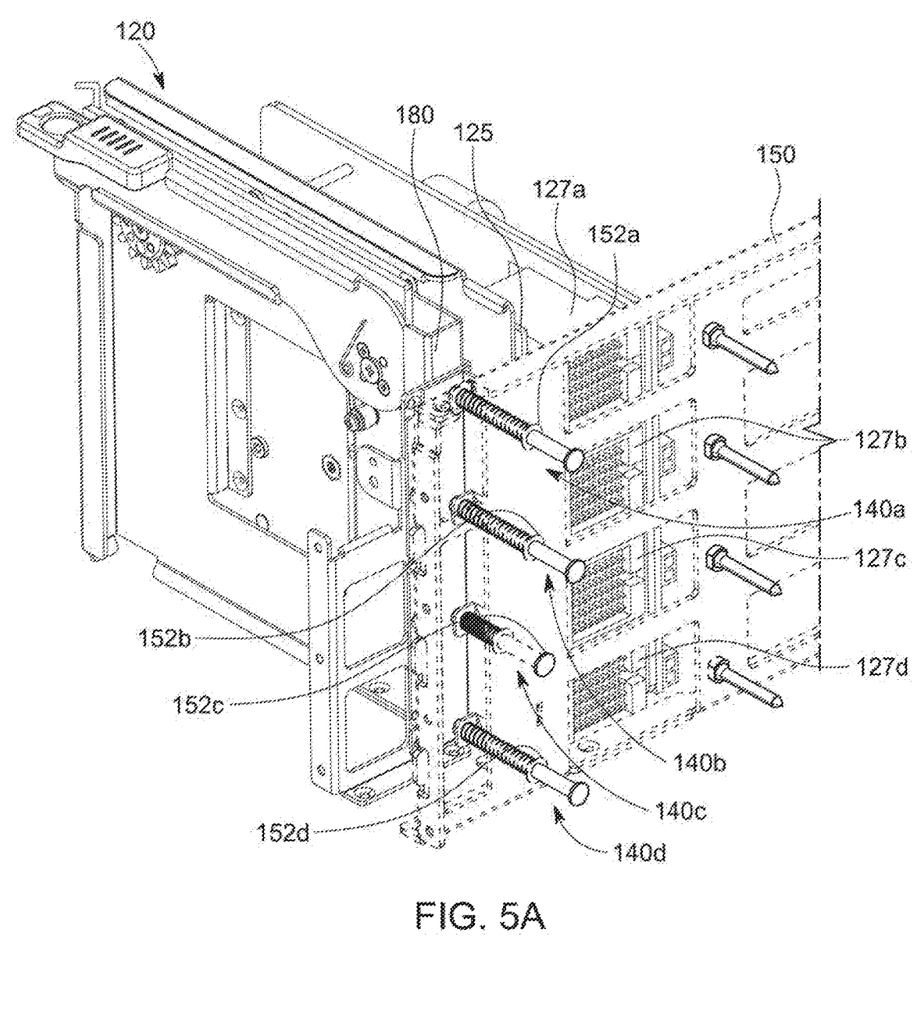
FIGS. 5A and 5B depict right perspective views of the plurality of lock pins disposed in a middle bracket between the horizontal and vertical modules with at least one lock pin positioned to engage with the receiving bracket of the vertical module, according to some implementations of the present disclosure.
Figure 5B:
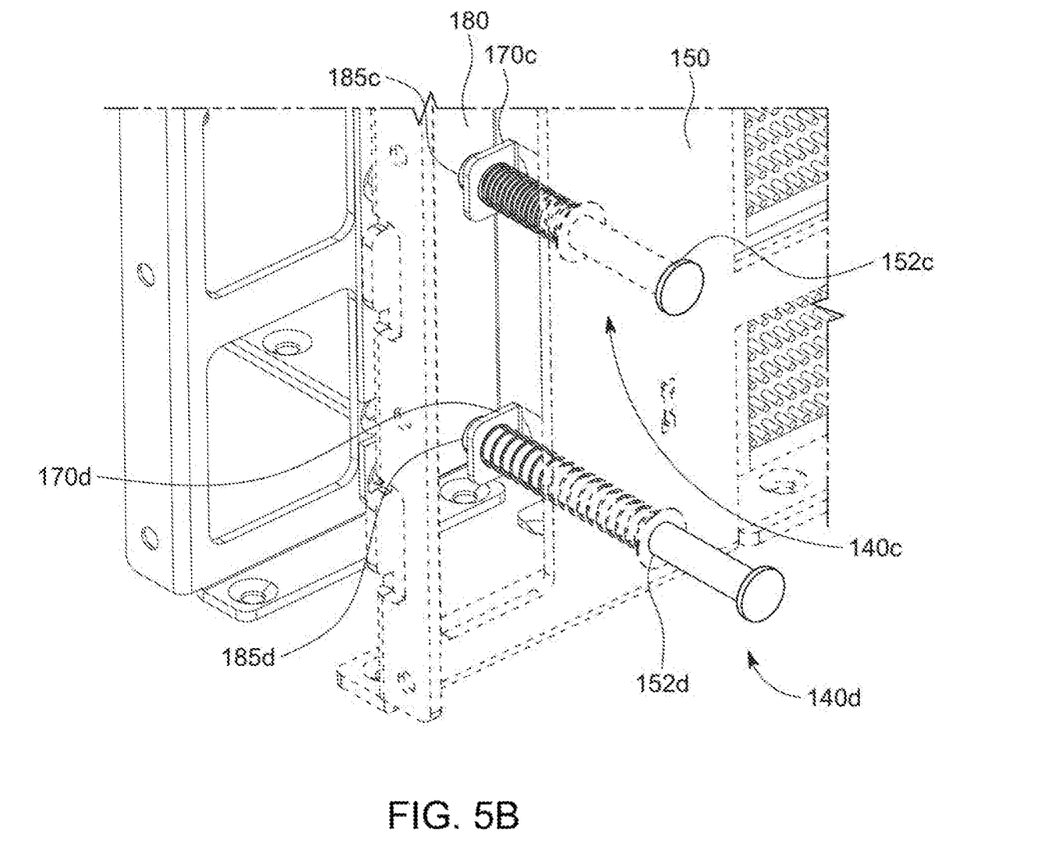

Turning to FIGS. 5A and 5B, right perspective views are depicted of the plurality of locking mechanisms 140a-140d discussed above where FIG. 3A corresponds to the left perspective view of the locking mechanisms 140a-140d as depicted in FIG. 3A, along with the middle bracket 150 and the vertical module 120. Similarly, FIG. 5B corresponds to the left perspective view of the locking mechanisms 140a-140d as depicted in FIG. 3B, along with the middle bracket 150 and the vertical module 120.

Figure 6A:
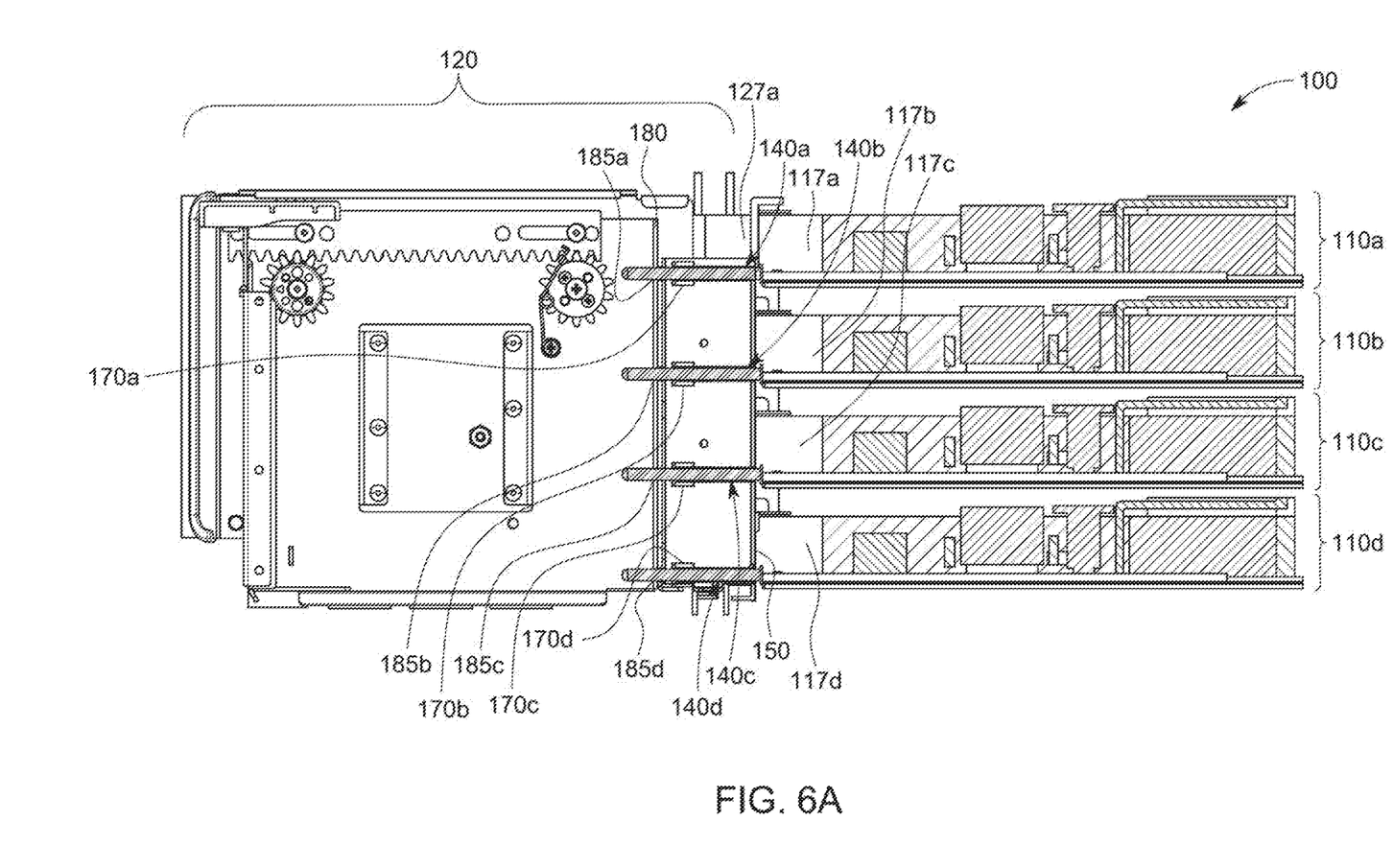
FIG. 6A is a side cross-sectional view of the computer chassis of FIG. 1 depicting the plurality of lock pins positioned to limit one of the vertical modules from being removed from the computer chassis, according to some implementations of the present disclosure.

Turning to FIG. 6A, a side cross-sectional view of the computer chassis 100 is depicted including the plurality of locking mechanisms 140a-140d each positioned to engage a fixed bracket 180 of the vertical module 120, thereby limiting the vertical module 120 from being removed from the computer chassis 100. The horizontal modules 110a-110d are each fully inserted into the computer chassis 100 such that the corresponding locking mechanisms 140a-140d have been fully urged to penetrate the corresponding holes 185a-185d in the fixed bracket 180. The locking mechanisms 140a-140d are supported by support brackets, including middle bracket 150 and secondary support brackets 170a-170d. Corresponding electrical connectors for the vertical module 120 and the horizontal modules 110a-110d are fully interfaced with each other, such as connector 127a disposed on the vertical module 120 and connector 117a disposed on horizontal module 110a.

Figure 6B:
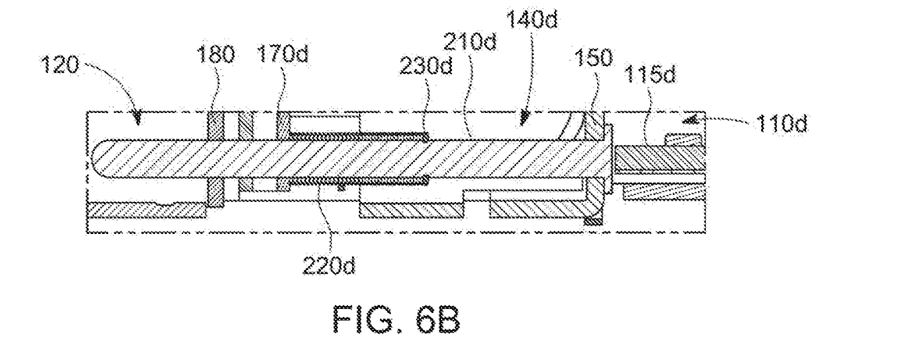
FIGS. 6B to 6D depict the lock pins horizontally moving to disengage from the receiving bracket of the vertical module as the horizontal modules abutting the lock pins move away from the vertical module, according to some implementations of the present disclosure.
Figure 6C:
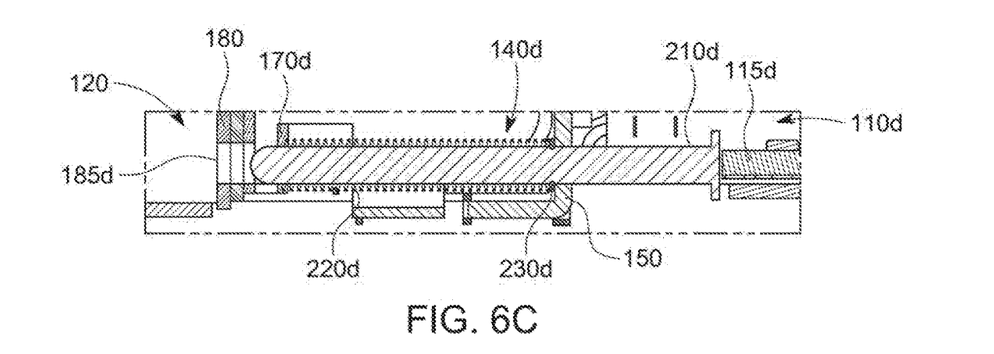
Figure 6D:
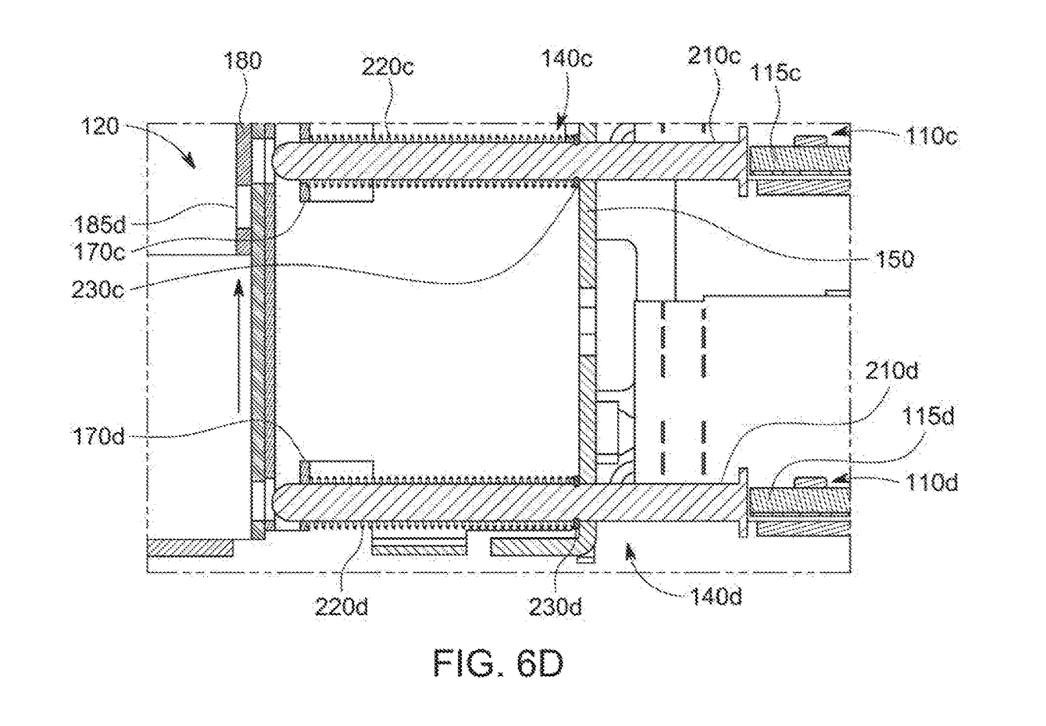

Referring to FIGS. 6B to 6D, the exemplary locking mechanisms 140c, 140d are depicted to show the disengagement of lock pins 210c, 210d from the fixed bracket 180 of the vertical module 120 as the horizontal modules 110c, 110d abutting the corresponding lock pins 210c, 210d are move away from the vertical module 120. As discussed in FIG. 2, the lock pins 210c, 210d move along respective longitudinal axes L of the elongated shaft (e.g., see element 212 in FIG. 2) from an engaged position (see FIG. 6B) with the vertical module 120 to a disengaged position (see FIG. 6C) in response to the corresponding horizontal modules 110c, 110d being removed from the computer chassis 100 (see FIG. 1). As illustrated in FIGS. 6B and 6C for locking mechanism 140d, the lock pin 210d is urged away from the hole 185d in the fixed bracket 180 of the vertical module 120 by a spring 220d acting on the spring stopper 230d as the horizontal module 110d is removed from the chassis 100 (FIG. 1). Once all lock pins for each of locking mechanisms 140a-140d are in the disengaged position, the electronic connectors of the vertical module 120 and the horizontal modules 110a-110d can be fully disconnected such that the vertical module 120 can be removed from the computer chassis 100, as depicted in FIG. 6D by the upward sliding of the fixed bracket 180 of the vertical module 120.

Figure 7A:
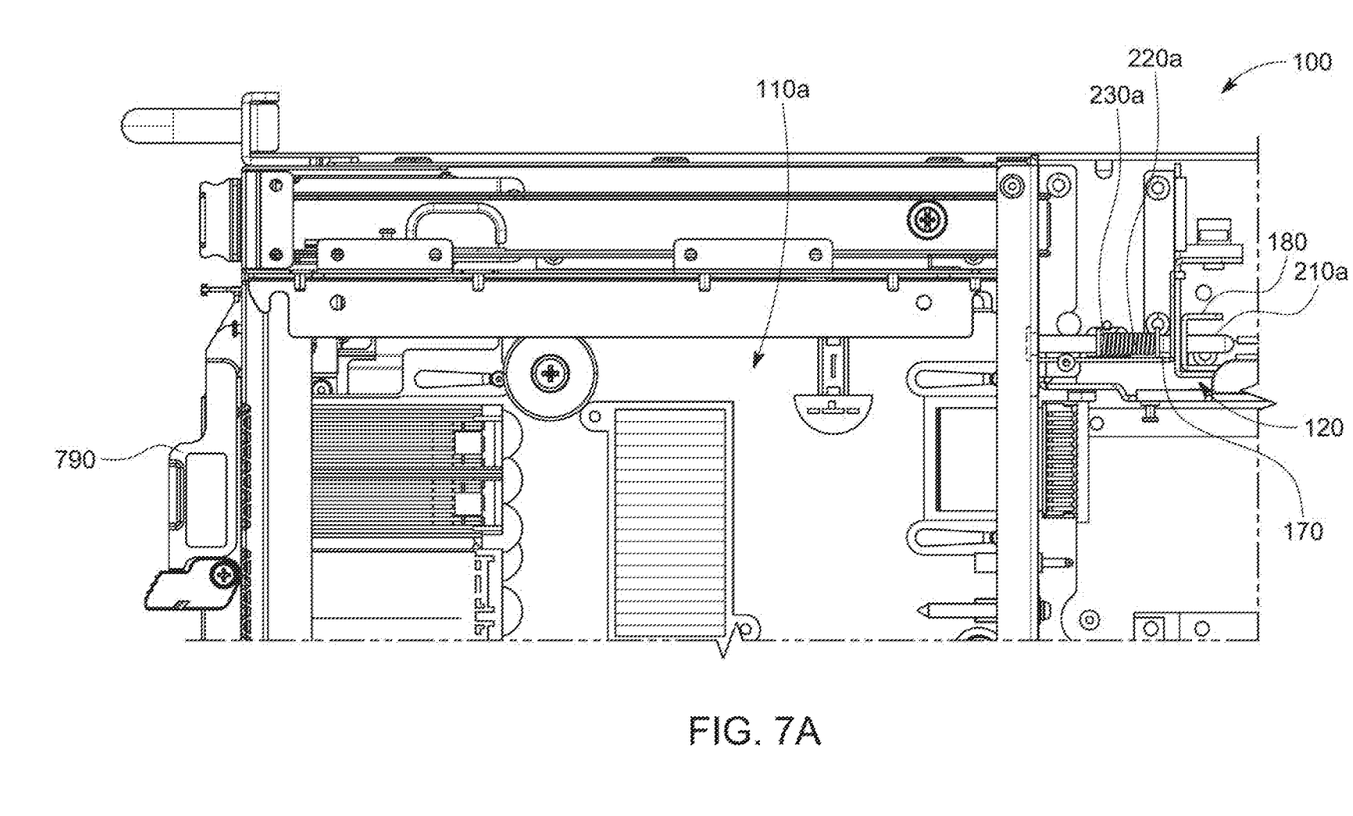
FIGS. 7A and 7B depict a top view of a horizontal module abutting a lock pin including the horizontal module being moved horizontally away from the vertical module, according to some implementations of the present disclosure.
Figure 7B:
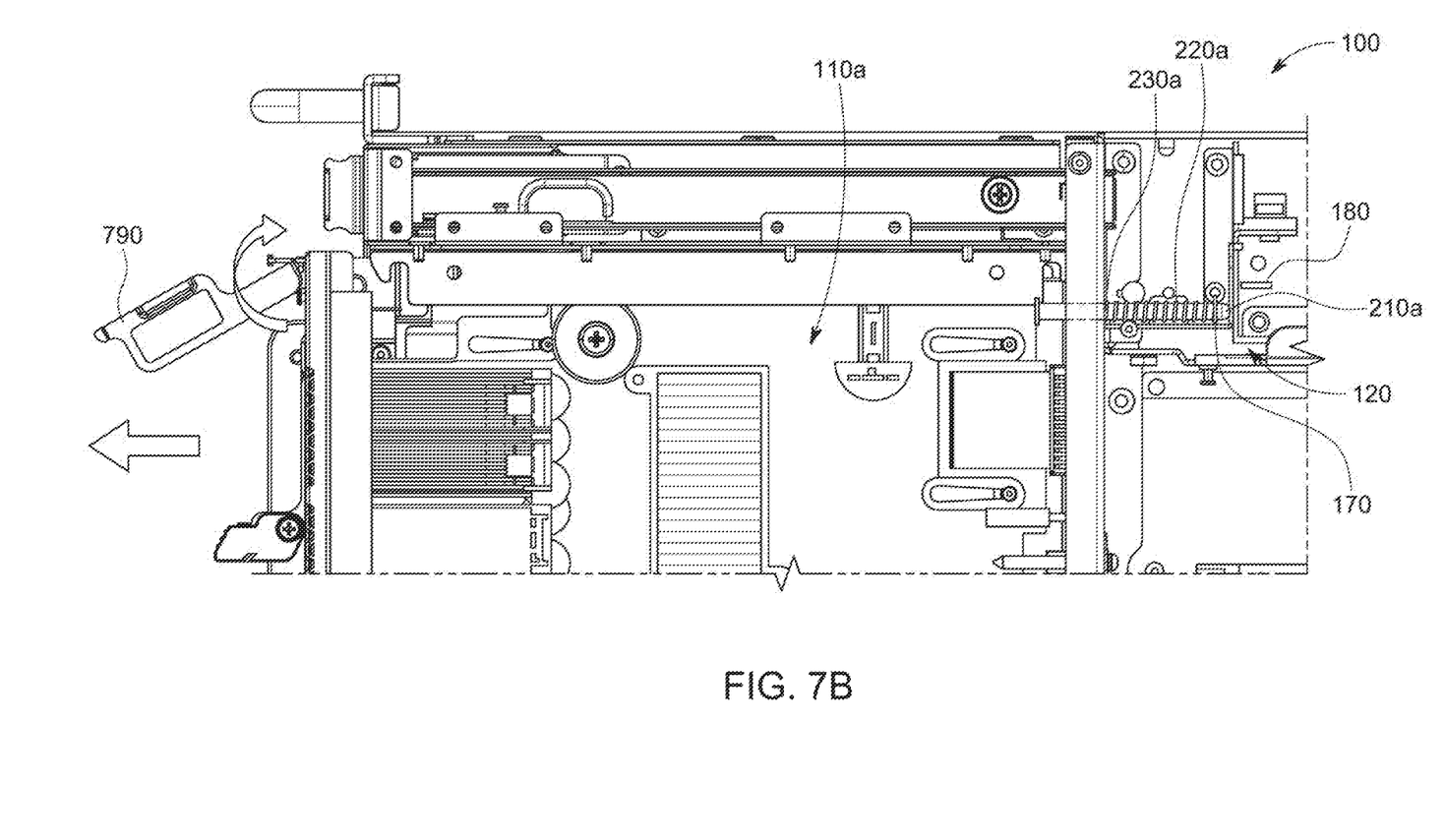

Turning now to FIGS. 7A and 7B, a partial top view of the computer chassis 100 is depicted including the horizontal module 110a. In FIG. 7A, the horizontal module 110a is fully inserted into the computer chassis 100 such that the lock pin 210a engages with the hole 185a (see FIGS. 4 and 6A) of the fixed bracket 180 of the vertical module 120, as described for example in the context of the side cross-section view of FIG. 6A. A spring 220a of the locking mechanism 140a is shown in the compressed position between the spring stopper 230a and the secondary support bracket 170 for the lock pin 210a.

In some implementations, the horizontal module 110a may include a latch 790 for securing the fully inserted horizontal module 110a in a corresponding receiving bracket of the computer chassis 100 (FIG. 1). Upon the release of the latch 790, as depicted in FIG. 7B, the horizontal module 110a can be slid out from the receiving bracket of the computer chassis 100. During this removal step, the locking pin 210a operates similarly what was described for FIGS. 6B to 6C. The portion of the lock pin 210a moves in the same direction as the horizontal module 110a until it entirely disengages from the hole 185a (see FIG. 6A) in fixed bracket 180 of the vertical module 120. The moving of the lock pin 210a out of the hole 185a allows the vertical module 120 to be removed once all the lock pins for the other locking mechanisms, such as locking mechanisms 110b-110d, have similarly been disengaged. The lock pin 210a moves out of the hole 185a of the fixed bracket 180 in response to the spring 220a expanding as the removing of the horizontal module 110a is initiated. The expanding of spring 220a causes the urging of the lock pin 210a in the direction of removal of the horizontal module 110a.

In some implementations, a method is performed for controlling the movement of a first removable module (e.g., the vertical module 120) in a computer chassis. The first removable module can include one or more electronic components configured to be connected to one or more other electronic components of a different second removable module (e.g., the horizontal module 110c). The method includes inserting the first removable module into a first receiving bracket (e.g., the fixed bracket 180) oriented to position the first removable module vertically or horizontally in the computer chassis. The different second removable module is inserted into a second receiving bracket (e.g., rear bracket 111C of FIG. 3B) until the second removable module abuts a lock pin disposed in one or more supports (e.g., the supporting brackets 170) of one or more intermediate bracket (e.g., the middle bracket 150) between the first removable module and the second removable module. The second receiving bracket is oriented to position the second removable module in the computer chassis such that the second removable module is positioned perpendicular to the first removable module. The second removable module then urges a portion of the lock pin into a hole of the first removable module by the second removable module being further inserted into the second receiving bracket to a fully inserted position. Once the second removable module is in the fully inserted position, the lock pin is positioned to prevent the first removable module from being removed.

A further aspect of the method includes the one or more electrical connections between the electronic components of the first removable module and the different second removable module being connected when the second removable module is in the fully inserted position. The lock pin can include an elongated shaft and a spring disposed about the elongated shaft. The spring can extend from a spring stopper disposed on the elongated shaft toward the end of the lock pin that is inserted into the hole of the first removable module. The spring is constrained by the spring stopper and one of the supports of the intermediate bracket such that the spring compresses as the second removable module urges the lock pin into the hole of the first removable module.

The illustrated aspects described above, including for FIGS. 1 to 7B, are primarily in the context of vertical and horizontal modules being inserted and removed from a computer chassis of a computing device. However, the described locking mechanism is applicable to other modules arrangements in a computer chassis. For example, rather than an inserted horizontal module limiting or controlling the removal of a vertical module, the locking mechanism can be arranged where an inserted vertical module controls the removal of a horizontal module. The described locking mechanism in the context of the vertical and horizontal modules, along with the methods of implementing the locking mechanism, have been presented by way of example only, and not limitation, and can include different combinations of the described elements.

While various embodiments of the present invention have been described above, it should be understood that they have been presented by way of example only, and not limitation. Numerous changes to the disclosed embodiments can be made in accordance with the disclosure herein without departing from the spirit or scope. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations, and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting. As used herein, the singular forms "a," "an," and "the" are intended to include the plural forms as well, unless the context clearly indicates otherwise. Furthermore, to the extent that the terms "including," "includes," "having," "has," "with," or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. Furthermore, terms, such as those defined in commonly used dictionaries, should be interpreted as having a meaning that is consistent with their meaning in the context of the relevant art and will not be interpreted in an idealized or overly formal sense unless expressly so defined herein.

What is claimed is:

1. A locking mechanism for a computing device, the locking mechanism controlling movement of a removable module including electronic components connected to other electronic components within a computer chassis, the locking mechanism comprising:
    a lock pin including an elongated shaft having a first diameter, the elongated shaft extending from a first end to an opposite second end;
    a head disposed at the first end, the head having a second diameter greater than the first diameter;
    a spring stopper disposed on the elongated shaft between the first end and the opposite second end; and
    a spring disposed about the elongated shaft such that the spring extends from the spring stopper toward the opposite second end of the elongated shaft,
    wherein as the lock pin moves along a longitudinal axis of the elongated shaft from a first position to a second position, the spring is configured to compress between the spring stopper and a fixed bracket in the computer chassis with the opposite second end extending through a hole in the removable module, thereby preventing the removable module from being removed from the computer chassis.

2. The locking mechanism of claim 1, wherein the removable module is positioned vertically in the computer chassis.

3. The locking mechanism of claim 1, wherein the lock pin is configured to move from the first position to the second position in response to another removable module including the other electronic components urging the head of the lock pin as the another removable module is inserted into a middle bracket of the computer chassis, wherein the electronic components of the removable module and the other electronic components of the another removable module are electrically connected when the lock pin is in the second position.

4. The locking mechanism of claim 3, wherein the electronic components of the removable module and the other electronic components of the another removable module are fully disconnected when the lock pin is in the first position.

5. The locking mechanism of claim 3, wherein the removable module is positioned vertically and the another removable module is positioned horizontally in the computer chassis.

6. The locking mechanism of claim 3, wherein the another removable module includes a rear bracket abutting the head of the lock pin during the urging of the head to the second position.

7. The locking mechanism of claim 1, wherein the lock pin is further configured to move along the longitudinal axis of the elongated shaft from the second position to the first position in response to another removable module including the other electronic components being removed from the computer chassis, the lock pin being urged away at the spring stopper from the hole of the removable module by the spring, thereby allowing the removable module to be removed from the computer chassis.

8. The locking mechanism of claim 7, wherein the electronic components of the removable module and the other electronic components of the another removable module are fully disconnected when the lock pin is in the first position.

9. The locking mechanism of claim 7, wherein the removable module is positioned horizontally and the another removable module is positioned vertically in the computer chassis.

10. The locking mechanism of claim 7, wherein the another removable module includes a rear bracket abutting the head of the lock pin during the urging of the head to the first position.

11. The locking mechanism of claim 1, wherein the spring stopper is fixed to the elongated shaft.

12. The locking mechanism of claim 1, wherein the spring stopper includes a ring structure concentric with the elongated shaft.

13. The locking mechanism of claim 1, wherein elongated shaft includes a groove about the circumference of the elongated shaft.

14. The locking mechanism of claim 1, wherein the spring stopper is secured to the elongated shaft via a protrusion penetrating into the groove.

15. The locking mechanism of claim 1, wherein the electronic components include a printed circuit board.

16. A method for controlling a movement of a first removable module in a computer chassis, the first removable module including one or more electronic components configured to be connected to one or more other electronic components in a second removable module, the method comprising:
    inserting the first removable module into a first receiving bracket oriented to position the first removable module vertically or horizontally in the computer chassis;
    inserting the second removable module into a second receiving bracket until the second removable module abuts a lock pin disposed in one or more supports of an intermediate bracket between the first removable module and the second removable module, the second receiving bracket oriented to position the second removable module in the computer chassis such that the second removable module is positioned perpendicular to the first removable module; and
    causing the second removable module to urge a portion of the lock pin into a hole of the first removable module by further inserting the second removable module into the second receiving bracket to a fully inserted position, thereby preventing the first removable module from being removed.

17. The method of claim 16, wherein the one or more electrical connections between the electronic components of the first removable module and the second removable module are connected when the second removable module is in the fully inserted position.

18. The method of claim 17, wherein the lock pin includes an elongated shaft and a spring disposed about the elongated shaft such that the spring extends from a spring stopper disposed on the elongated shaft toward an end of the lock pin inserted into the hole, the spring being constrained by the spring stopper and one of the supports of the intermediate bracket such that the spring compresses as the second removable module urges the lock pin into the hole of the first removable module.

19. The method of claim 18, further comprising:
causing the portion of the lock pin to move out of the hole of the first removable module by initiating removal from the fully inserted position of the second removable module from the second receiving bracket, thereby allowing the first removable module to be removed from the first receiving bracket and allowing the one or more electrical connections between the electronic components of the first removable module and the second removable module to be disconnected.

20. The method of claim 19, wherein the lock pin moves out of the hole of the first removable module in response to the spring expanding as the removing of the second removable module is initiated, the expanding spring causing the urging of the lock pin in the direction of removal.

* * * * *